(12) United States Patent
Song et al.

(10) Patent No.: US 11,307,608 B2
(45) Date of Patent: Apr. 19, 2022

(54) INTEGRATED CIRCUIT AND ELECTRONIC DEVICE FOR CONTROLLING FUNCTION MODULES IN LOW-POWER STATE ACCORDING TO OPERATION STATE, AND CONTROL METHOD THEREFOR

(71) Applicant: Samsung Electronics Co., Ltd., Gyeonggi-do (KR)

(72) Inventors: Minwoo Song, Gyeonggi-do (KR); Younghyun Ban, Gyeonggi-do (KR); Juyoung Lim, Gyeonggi-do (KR); Chulmin Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/971,049

(22) PCT Filed: Mar. 5, 2019

(86) PCT No.: PCT/KR2019/002484
§ 371 (c)(1),
(2) Date: Aug. 19, 2020

(87) PCT Pub. No.: WO2019/172590
PCT Pub. Date: Sep. 12, 2019

(65) Prior Publication Data
US 2021/0089074 A1 Mar. 25, 2021

(30) Foreign Application Priority Data
Mar. 5, 2018 (KR) .................... 10-2018-0025907

(51) Int. Cl.
*G06F 1/10* (2006.01)
*G06F 1/06* (2006.01)
*H03K 5/00* (2006.01)

(52) U.S. Cl.
CPC .............. *G06F 1/10* (2013.01); *G06F 1/06* (2013.01); *H03K 5/00006* (2013.01)

(58) Field of Classification Search
CPC ..... G06F 1/02; G06F 1/04; G06F 1/08; G06F 1/10; G06F 1/12; H03K 3/012;
(Continued)

(56) References Cited

U.S. PATENT DOCUMENTS 7,797,561 B1 * 9/2010 Abdalla ................ G06F 1/3287
713/322
7,849,348 B1 * 12/2010 Sidiropoulos .......... G11C 7/222
713/500

(Continued)

FOREIGN PATENT DOCUMENTS

JP 2011-210265 A 10/2011
KR 10-2007-0049328 A 5/2007
(Continued)

*Primary Examiner* — John W Poos
(74) *Attorney, Agent, or Firm* — Cha & Reiter, LLC.

(57) ABSTRACT

Disclosed are an integrated circuit for controlling function modules to a low-power status depending on an operating status, an electronic device, and a control method thereof. An integrated circuit includes at least one clock generator, a clock distribution circuit that distributes a clock generated by the at least one clock generator, a plurality of function modules that receive the clock distributed by the clock distribution circuit, a monitoring circuit that monitors operating statuses of the at least one clock generator and the clock distribution circuit, a memory, and at least one control circuit. When the operating statuses of the at least one clock generator and the clock distribution circuit monitored by the monitoring circuit correspond to a specified operating status, the at least one control circuit is configured to control at least one of at least one function module of the plurality of function modules, the at least one clock generator, or the clock distribution circuit based on a specified control
(Continued)

method. Moreover, various embodiment found through the disclosure are possible.

14 Claims, 11 Drawing Sheets

(58) Field of Classification Search
CPC .. H03K 5/1565; H03K 5/135; H03K 5/00006; H03L 7/07; H03L 7/0814; H03L 7/087; H03L 7/0812; H03L 7/06
See application file for complete search history.

(56) References Cited

U.S. PATENT DOCUMENTS

| | | | |
|---|---|---|---|
| 8,335,935 B2 | 12/2012 | Thomas et al. | |
| 9,391,615 B2 | 7/2016 | Shin et al. | |
| 9,541,992 B2 | 1/2017 | Lee et al. | |
| 9,678,556 B2 | 6/2017 | Pal et al. | |
| 10,126,794 B2 | 11/2018 | Bang et al. | |
| 10,375,207 B2 | 8/2019 | Chae et al. | |
| 10,613,620 B2 | 4/2020 | Kumar et al. | |
| 2011/0248758 A1* | 10/2011 | Tokue | G06F 1/324 327/172 |
| 2012/0079290 A1 | 3/2012 | Kumar et al. | |
| 2013/0185570 A1 | 7/2013 | Kumar et al. | |
| 2021/0091756 A1* | 3/2021 | Iwata | G06F 1/08 |

FOREIGN PATENT DOCUMENTS

| | | |
|---|---|---|
| KR | 10-2014-0033663 A | 3/2014 |
| KR | 10-1476568 B1 | 12/2014 |
| KR | 10-2016-0024581 A | 3/2016 |
| KR | 10-2016-0104965 A | 9/2016 |
| KR | 10-2016-0119121 A | 10/2016 |
| KR | 10-2017-0088768 A | 8/2017 |
| KR | 10-2017-0092451 A | 8/2017 |
| KR | 10-2017-0098106 A | 8/2017 |

* cited by examiner

INTEGRATED CIRCUIT AND ELECTRONIC DEVICE FOR CONTROLLING FUNCTION MODULES IN LOW-POWER STATE ACCORDING TO OPERATION STATE, AND CONTROL METHOD THEREFOR

CROSS REFERENCE TO RELATED APPLICATIONS

This application is a National Phase Entry of PCT International Application No. PCT/KR2019/002484, which was filed on Mar. 5, 2019, and claims a priority to Korean Patent Application No. 10-2018-0025907, which was filed on Mar. 5, 2018, the contents of which are incorporated herein by reference.

TECHNICAL FIELD

Embodiments of the disclosure relate to a technology for controlling function modules based on operating statuses of a clock generator and a clock distribution circuit.

BACKGROUND ART

To efficiently use a resource of an electronic device, the electronic device may store a list of application programs and may use a control method defined for each application program.

For example, a memory of the electronic device may store a list of application programs corresponding to a game application program and a control method upon execution of the game application program. When an application program included in the list is executed, the electronic device may adjust a resolution or a frame rate based on the stored control method.

DISCLOSURE

Technical Problem

An application program list is required to use a control method for each application program stored in advance. However, there are the following issues: the list has to be updated by a user, and an electronic device fails to efficiently use a resource when executing an application program not included in the list.

Various embodiments of the disclosure may control an electronic device in an efficient control method by monitoring operating statuses of a clock generator, which supplies a clock to a plurality of function modules, and a clock distribution circuit.

Technical Solution

According to an embodiment of this disclosure, an integrated circuit may include at least one clock generator, a clock distribution circuit that distributes a clock generated by the at least one clock generator, a plurality of function modules that receive the clock distributed by the clock distribution circuit, a monitoring circuit that monitors operating statuses of the at least one clock generator and the clock distribution circuit, a memory, and at least one control circuit. When the operating statuses of the at least one clock generator and the clock distribution circuit monitored by the monitoring circuit correspond to a specified operating status, the at least one control circuit may be configured to control at least one of at least one function module of the plurality of function modules, the at least one clock generator, or the clock distribution circuit based on a specified control method.

According to an embodiment of this disclosure, an electronic device may include a memory, a clock generator, a clock distribution circuit that distributes a clock generated by the clock generator, and at least one processor that includes a plurality of function modules supplied with the clock from the clock distribution circuit. The at least one processor may be configured to execute an application, to verify a status of a resource allocated to at least a part of the plurality of function modules with regard to the execution of the application, to determine a category of the application, based at least on the status of the resource, and to change at least one function module, which is not used in the category, from among the plurality of function modules to a low-power status based at least on the determined category.

According to an embodiment of this disclosure, a method for controlling a plurality of function modules included in an integrated circuit may include generating a clock by using at least one clock generator, distributing the generated clock to a plurality of function modules by using a clock distribution circuit including a plurality of nodes, monitoring operating statuses of the at least one clock generator and the plurality of nodes, and controlling at least one of at least one function module of the plurality of function modules, the at least one clock generator, or the clock distribution circuit based on a specified control method, when the monitored operating statuses of the at least one clock generator and the plurality of nodes correspond to a specified operating status.

Advantageous Effects

According to embodiments of the disclosure, even when data associated with a category of an application program are not included in a memory of an electronic device, it may be possible to determine the category of the application program and to efficiently use a resource for execution of an application program to be executed.

According to embodiments of the disclosure, even when one application program is executed, a processor may control an electronic device in a different manner depending on operating statuses of a clock generator and a clock distribution circuit.

Besides, a variety of effects directly or indirectly understood through this disclosure may be provided.

With regard to description of drawings, the same or similar components will be marked by the same or similar reference signs.

MODE FOR INVENTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
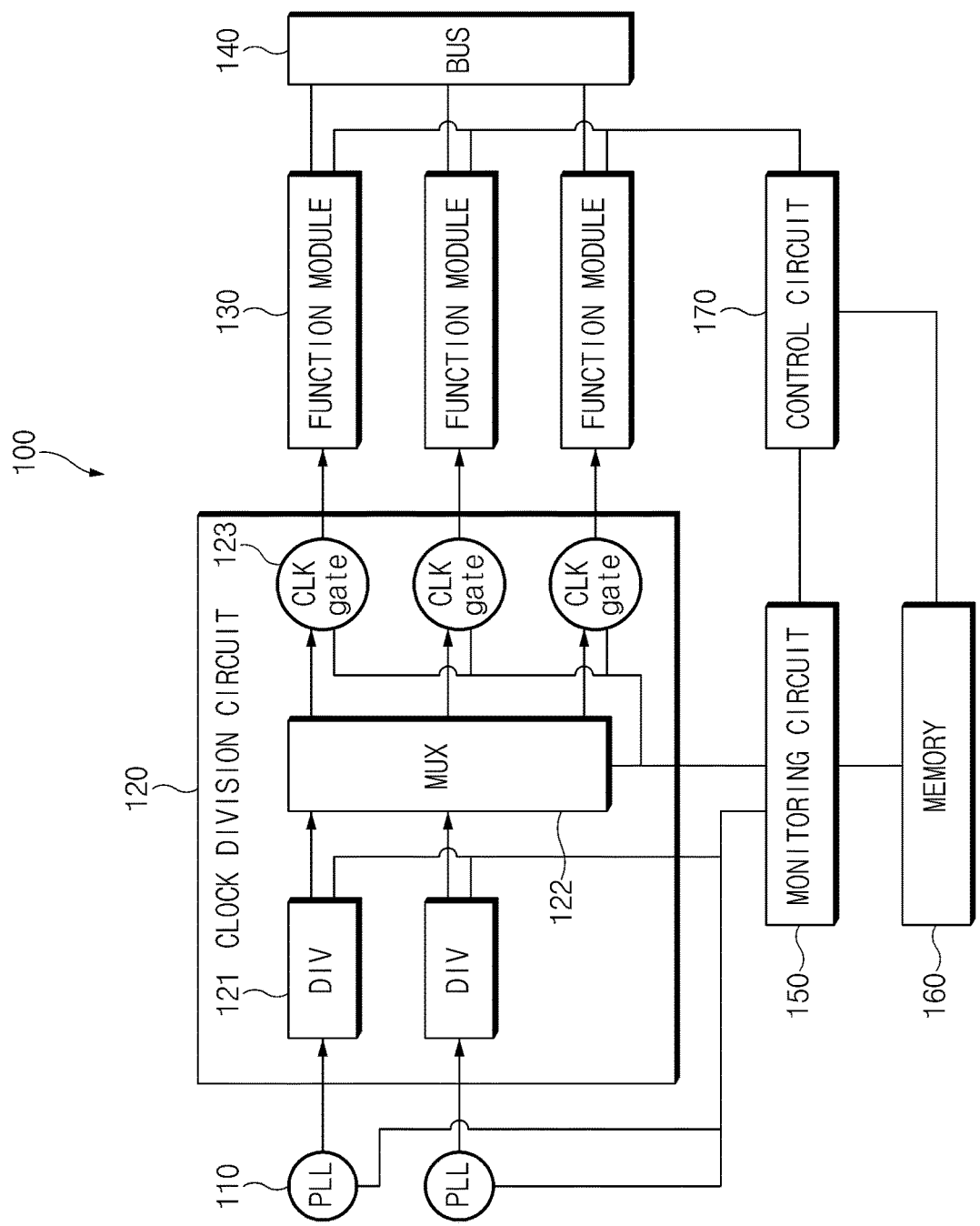
FIG. 1 is a block diagram illustrating an integrated circuit according to an embodiment.

FIG. 1 is a block diagram illustrating an integrated circuit according to an embodiment.

Referring to FIG. 1, an integrated circuit (IC) 100 according to an embodiment may include at least one clock generator 110, a clock distribution circuit 120, a plurality of function modules 130, a bus 140, a monitoring circuit 150, a memory 160, and at least one control circuit 170.

The clock generator 110 may generate a given clock. According to an embodiment, the clock generator 110 may be a phase locked loop (PLL). A frequency that the clock generator 110 generates may be output to the clock distribution circuit 120.

The clock distribution circuit 120 may distribute a clock generated by the clock generator 110 into the plurality of function modules 130.

According to an embodiment, the clock distribution circuit 120 may be implemented in a tree structure. According to an embodiment, the clock distribution circuit 120 may include a plurality of components. According to an embodiment, the plurality of components may include at least one divider 121, a multiplexer 122, and a plurality of clock gates 123.

The divider 121 may divide a frequency of an input clock by an integer and may output a clock of the divided frequency. The multiplexer 122 may select one of a plurality of inputs and may provide a single output. The clock gates 123 may be respectively connected with the plurality of function modules 130 and may determine whether to apply a clock.

According to an embodiment, a clock that is supplied to the function modules 130 may be determined based on operating statuses of the plurality of components 121, 122, and 123 of the clock distribution circuit 120.

According to an embodiment, the plurality of function modules 130 may be supplied with the clock from the clock distribution circuit 120. According to an embodiment, the plurality of function modules 130 may include at least one of a CPU, a GPU G3D, a video codec, a camera module, or an audio module.

According to an embodiment, the function modules 130 may include a plurality of sub function modules 130. According to an embodiment, the control circuit 170 may control the sub function modules 130 independently of each other.

The bus 140 may interconnect the plurality of function modules 130 and may include a circuit that transfers signals between function blocks.

The monitoring circuit 150 may monitor operating statuses of the at least one clock generator 110 and the plurality of components 121, 122, and 123 included in the clock distribution circuit 120.

According to an embodiment, the monitoring circuit 150 may include a plurality of sub monitoring circuits and a main monitoring circuit. According to an embodiment, the sub monitoring circuits may monitor operating statuses of the clock generator 110 and the plurality of components 121, 122, and 123 included in the clock distribution circuit 120. According to an embodiment, the main monitoring circuit may receive information about the operating statuses of the clock generator 110 and the plurality of components 121, 122, and 123 included in the clock distribution circuit 120 from the sub monitoring circuits.

For example, the sub monitoring circuits may be disposed together with the plurality of function modules 130. The main monitoring circuit may be connected with the plurality of sub monitoring circuits and may receive information about the respective operating statuses of the at least one clock generator 110 and the plurality of components 121, 122, and 123 included in the clock distribution circuit 120 from the plurality of sub monitoring circuits.

According to an embodiment, an operating status of the at least one clock generator 110 may include whether the at least one clock generator 110 operates and an operating time of the at least one clock generator 110. The operating statuses of the plurality of components 121, 122, and 123 included in the clock distribution circuit 120 may include a clock division ratio of the divider 121, information about selection of the multiplexer 122 (e.g., information about an input that the multiplexer 122 selects), whether the clock gates 123 are enabled, and operating times of the divider 121, the multiplexer 122, and the clock gates 123.

The memory 160 may include a volatile and/or nonvolatile memory 160. For example, the memory 160 may store instructions or data associated with at least one other component of an electronic device or the integrated circuit 100.

According to an embodiment, the memory 160 may store a mapping table that includes control methods designated according to operating statuses of the at least one clock generator 110 and the clock distribution circuit 120 detected by the monitoring circuit 150.

According to an embodiment, the memory 160 may store a mapping table that includes categories corresponding to performance statuses of the integrated circuit 100 according to the operating statuses of the at least one clock generator 110 and the clock distribution circuit 120 detected by the monitoring circuit 150.

Table 1 below shows a mapping table according to an embodiment.

TABLE 1

| Categories | Control methods | PLL 1 | | PLL 1 | | MUX | | DIV 1 | | DIV 1 | | Clk gate 1 | | Clk gate 2 | |
|---|---|---|---|---|---|---|---|---|---|---|---|---|---|---|---|
| | Comparison conditions | C1 | C2 | C1 | C2 | C1 | C2 | C1 | C2 | C1 | C2 | C1 | C2 | C1 | C2 |
| Video | Operation 1 | 1 | L1 | 0 | L2 | 00 | L1 | 2 | L1 | 3 | L1 | 1 | L1 | 1 | L3 |
| Music | Operation 2 | 0 | L1 | 1 | L1 | 01 | L2 | 3 | L2 | 2 | L3 | 0 | L1 | 0 | L3 |
| Game | Operation 3 | 1 | L1 | 1 | L2 | 01 | L3 | 3 | L1 | 3 | L2 | 1 | L1 | 0 | L3 |

In Table 1 according to an embodiment, C1 may indicate whether the clock generator 110 and the components 121, 122, and 123 included in the clock distribution circuit 120 operate and operating attributes thereof, and C2 may indicate operating times of the clock generator 110 and the components 121, 122, and 123 included in the clock distribution circuit 120.

For example, C1 of PLL may indicate whether the clock generator 110 operates, C1 of MUX may indicate information about an input that the multiplexer 122 selects, C1 of DIV may indicate a division ratio of the divider 121, and C1 of Clk gate may indicate whether the clock gate 123 is enabled. C2 of the clock generator 110, MUX, DIV, and Clk gate may indicate times when the clock generator 110 and the components 121, 122, and 123 included in the clock distribution circuit 120 operate in statuses corresponding to C1. For example, L0 indicates 0 to 100 ms, L1 indicates 100 ms to 500 ms, L2 indicates 500 ms to 1 s, and L3 indicates more than 1 s. According to an embodiment, times that L0, L1, L2, and L3 of the clock generator 110 and the components 121, 122, and 123 included in the clock distribution circuit 120 indicate may be differently defined for each of the clock generator 110 and the components 121, 122, and 123 included in the clock distribution circuit 120.

According to an embodiment, the memory 160 may store a mapping table that includes operating statuses of the at least one clock generator 110 and the clock distribution circuit 120 detected by the monitoring circuit 150 and categories corresponding to performance statuses of the integrated circuit according to the operating statuses.

When the monitored operating statuses of the at least one clock generator 110 and the components 121, 122, and 123 included in the clock distribution circuit 120 correspond to a specified operating status, the at least one control circuit 170 may control at least one of at least one function module 130 of the plurality of function modules 130, the at least one clock generator 110, or the clock distribution circuit 120, based on a specified control method.

According to an embodiment, the control circuit 170 may be a processor. According to an embodiment, the control circuit 170 may be a module for performing a specific function. For example, the control circuit 170 may be a power management module. For example, when operating statuses of the at least one clock generator 110 and the components 121, 122, and 123 included in the clock distribution circuit 120 correspond to a specified operating status, the power management module may block a power of the specified function module 130.

Various operations of the control circuit 170 will be more fully described below.

Below, a method in which a clock generator and a clock distribution circuit supply a clock to a function module will be described with reference to FIG. 2.

Figure 2:
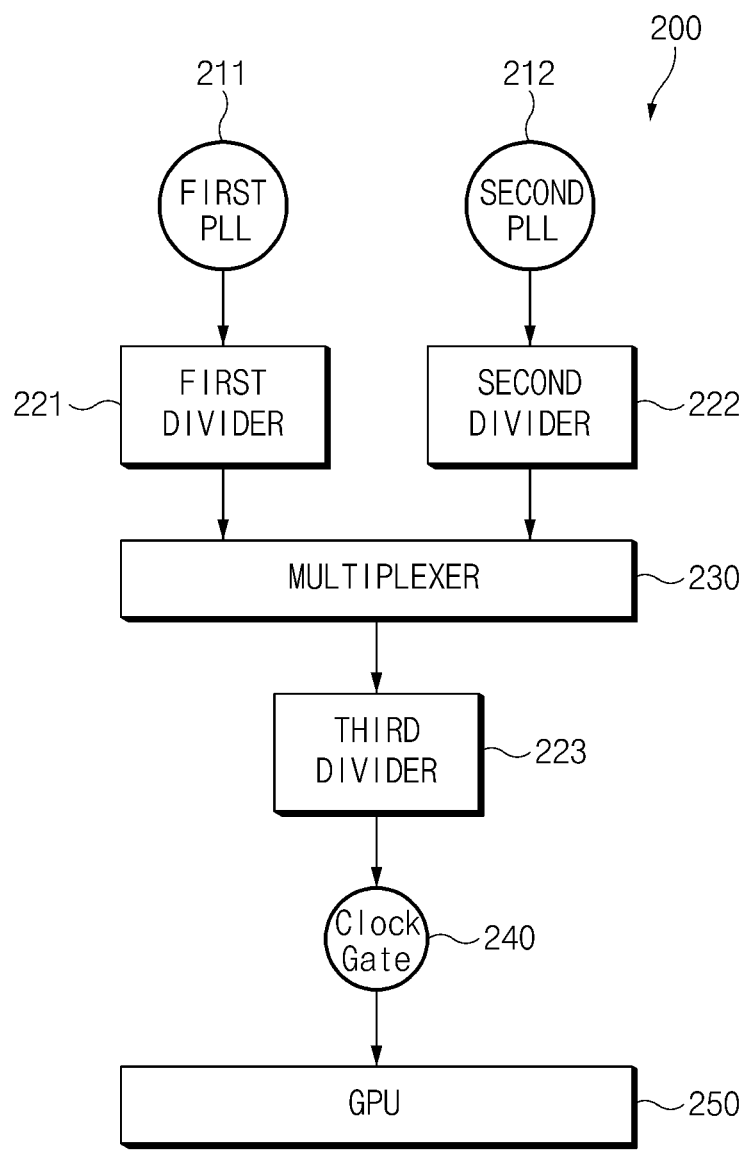
FIG. 2 is a diagram illustrating a clock generator and a clock distribution circuit according to an embodiment.

FIG. 2 is a diagram illustrating a clock generator and a clock distribution circuit according to an embodiment.

An integrated circuit according to an embodiment may include a first clock generator 211 to generate a clock of about 900 MHz and a second clock generator 212 to generate a clock of about 999 MHz. A clock that the first clock generator 211 generates may be output to a first divider 221, and a clock that the second clock generator 212 may be output to a second divider 222. The first divider 221 and the second divider 222 may divide frequencies of input clocks by an integer so as to be output to a multiplexer 230.

The multiplexer 230 may select a clock input from the first divider 221 or a clock input from the second divider 222 and may output a clock of the selected divider to a third divider 223. The third divider 223 may divide a frequency of an input clock and may output a clock of the divided frequency to a clock gate 240. The clock gate 240 may determine whether to output an input clock to a GPU 250 being a function module. According to an embodiment, when the clock gate 240 is enabled, a clock may be supplied to the GPU 250; when the clock gate 240 is disabled, a clock supply may be blocked.

According to an embodiment, in FIG. 2, it is assumed that a division ratio of the first divider is ½, a division ratio of the second divider 222 is ⅓, a division ratio of the third divider 223 is ⅓, and the clock gate 240 is enabled. When the multiplexer 230 selects a clock input from the first divider 221, the GPU 250 may be supplied with a clock of about 150 MHz. When the multiplexer 230 selects a clock input from the second divider 222, the GPU 250 may be supplied with a clock of about 111 MHz.

According to another embodiment, in FIG. 2, it is assumed that a division ratio of the first divider is ⅓, a division ratio of the second divider 222 is ⅓, a division ratio of the third divider 223 is ⅓, and the clock gate 240 is enabled. When the multiplexer 230 selects a clock input from the first divider 221, the GPU 250 may be supplied with a clock of about 100 MHz. When the multiplexer 230 selects a clock input from the second divider 222, the GPU 250 may be supplied with a clock of about 111 MHz.

As described above, a frequency of a clock to be supplied to a function module and whether to supply a clock may be determined based on operating statuses of a clock generator and components included in a clock distribution circuit.

Figure 3:
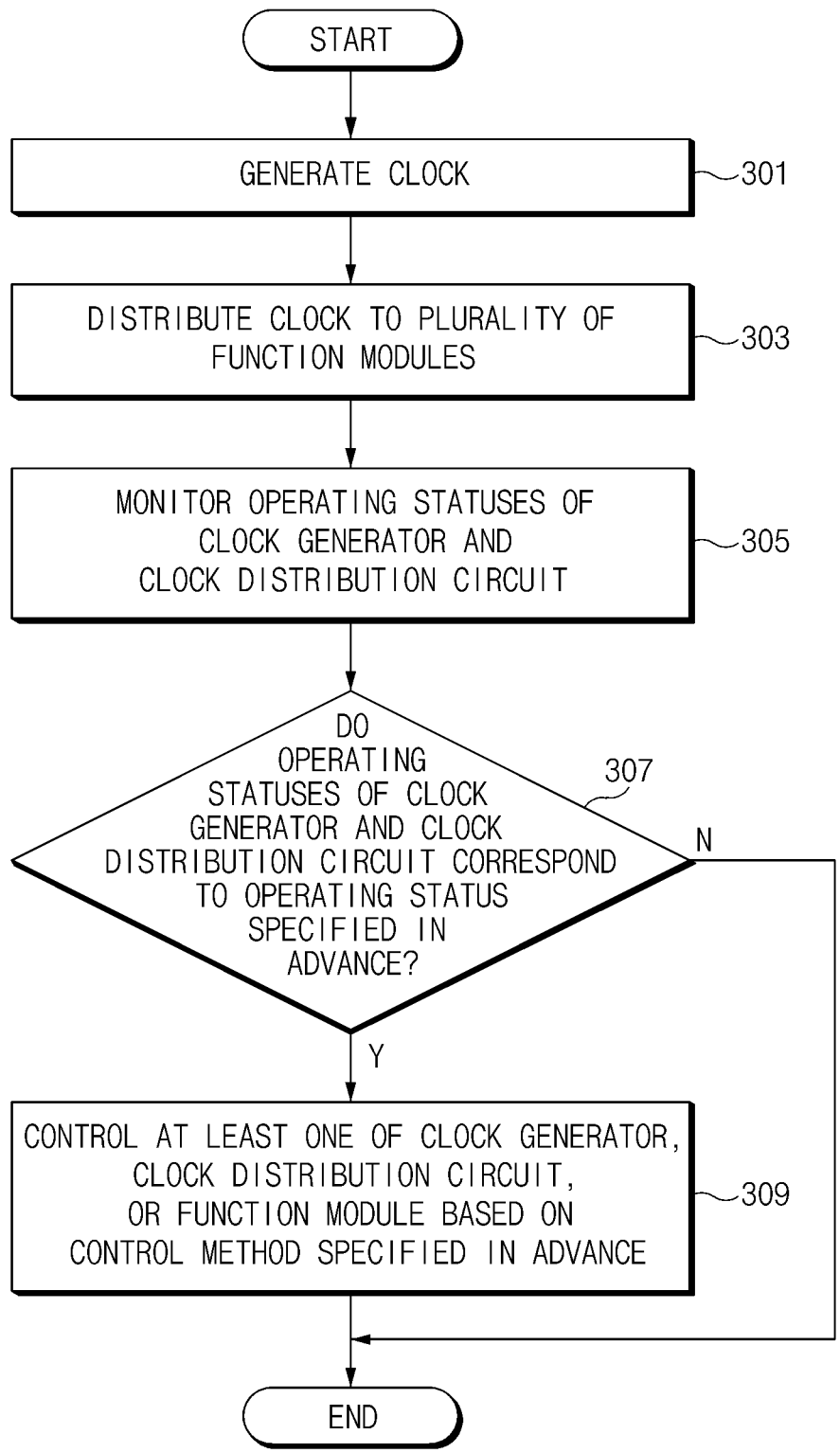
FIG. 3 is a flowchart illustrating a method in which an integrated circuit according to an embodiment controls function modules based on operating statuses of a clock generator and components included in a clock distribution circuit.

FIG. 3 is a flowchart illustrating a method in which an integrated circuit according to an embodiment controls function modules based on operating statuses of a clock generator and components included in a clock distribution circuit.

Below, it is assumed that the integrated circuit 100 of FIG. 1 performs a process of FIG. 3.

In operation 301, the at least one clock generator 110 may generate a clock and may output the clock to the clock distribution circuit.

In operation 303, the clock distribution circuit 120 may distribute the clock from the clock generator 110 into the plurality of function modules 130.

According to an embodiment, a clock to be supplied to the plurality of function modules 130 and whether to supply the clock may be determined based on operating statuses of the plurality of components 121, 122, and 123 included in the clock distribution circuit.

In operation 305, the monitoring circuit 150 may monitor operating statuses of the clock generator 110 and the plurality of components 121, 122, and 123 included in the clock distribution circuit 120.

According to an embodiment, the monitoring circuit 150 may monitor whether the at least one clock generator 110 operates. According to an embodiment, the monitoring circuit 150 may further monitor an operating time of the at least one clock generator 110.

According to an embodiment, the monitoring circuit 150 may monitor a clock division ratio of the divider 121, information about selection of the multiplexer 122, and whether the clock gate 123 is enabled. According to an embodiment, the monitoring circuit 150 may further monitor a time when the divider 121, the multiplexer 122, and the clock gate 123 operate in a current status.

In operation 307, the control circuit 170 may determine whether operating statuses of the clock generator 110 and the plurality of components 121, 122, and 123 included in the clock distribution circuit 120 correspond to a specified operating status.

According to an embodiment, the control circuit 170 may determine whether the operating statuses of the clock generator 110 and the plurality of components 121, 122, and 123 included in the clock distribution circuit 120 correspond to the specified operating status, by using a mapping table stored in the memory 160.

When the operating statuses of the clock generator 110 and the components 121, 122, and 123 included in the clock distribution circuit 120 correspond to the specified operating status, in operation 309, the control circuit 170 may control at least one of at least one function module 130 of the plurality of function modules 130, the at least one clock generator 110, or the clock distribution circuit, based on a specified control method.

According to an embodiment, the control circuit 170 may control at least one of the at least one function module 130, the at least one clock generator 110, or the clock distribution circuit, based on the specified control method by using the mapping table stored in the memory 160.

For example, when the operating statuses of the clock generator 110 and the components 121, 122, and 123 included in the clock distribution circuit 120 correspond to the specified operating status included in the mapping table, the control circuit 170 may control at least one of the at least one function module 130, the at least one clock generator 110, or the clock distribution circuit, based on a control method corresponding to the operating status included in the mapping table.

According to an embodiment, when the operating statuses of the at least one clock generator 110 and the components 121, 122, and 123 included in the clock distribution circuit 120 are maintained in the specified operating status during a time specified in advance, the control circuit 170 may control at least one of at least one function module 130 of the plurality of function modules 130, the at least one clock generator 110, or the clock distribution circuit, based on a specified control method.

For example, in the case where the specified time is about 300 ms, when about 300 ms passes in a state where the operating statuses of the at least one clock generator 110 and the components 121, 122, and 123 included in the clock distribution circuit 120 correspond to the specified operating status, the control circuit 170 may control at least one of the at least one function module 130, the at least one clock generator 110, or the clock distribution circuit, based on the specified control method.

According to an embodiment, the control based on the specified control method may include controlling at least one of the at least one clock generator 110 or the clock distribution circuit such that a clock of a specified frequency is supplied to one or more function modules 130 specified in advance. For example, when the operating statuses of the at least one clock generator 110 and the components 121, 122, and 123 included in the clock distribution circuit 120 correspond to an operating status associated with the case where an electronic device plays a high-definition video, the control circuit 170 may control the clock generator 110 and the clock distribution circuit 120 such that a specified frequency of about 800 MHz is supplied to a GPU.

According to an embodiment, the control based on the specified control method may include turning on or off one or more function modules 130 specified in advance. For example, when the operating statuses of the at least one clock generator 110 and the components 121, 122, and 123 included in the clock distribution circuit 120 correspond to an operating status associated with playing a music, the control circuit 170 may turn off a video codec block. According to an embodiment, to turn off the video codec block, the control circuit 170 may control a power management module supplying a power to the video codec block or may disable the clock gate 123 supplying a clock to the video codec block.

In an embodiment, the function module 130 may include the plurality of sub function modules 130. According to an embodiment, the control based on the specified control method may include turning on or off one or more sub function modules 130 specified in advance.

According to an embodiment, when the operating statuses of the at least one clock generator 110 and the plurality of components 121, 122, and 123 included in the clock distribution circuit 120 correspond to the specified operating status, the control circuit 170 may determine a category to which a performance status of the integrated circuit corresponds.

For example, when the operating statuses of the clock generator 110 and the plurality of components 121, 122, and 123 included in the clock distribution circuit 120 correspond to an operating status included in the mapping table, the control circuit 170 may determine a category corresponding to the operating status included in the mapping table as the category to which the performance status of the integrated circuit corresponds.

According to an embodiment, a category may include at least one of a video playback category, a game execution category, a web surfing category, or a music playback category. However, a kind of a category is not limited to the above examples.

Figure 4:
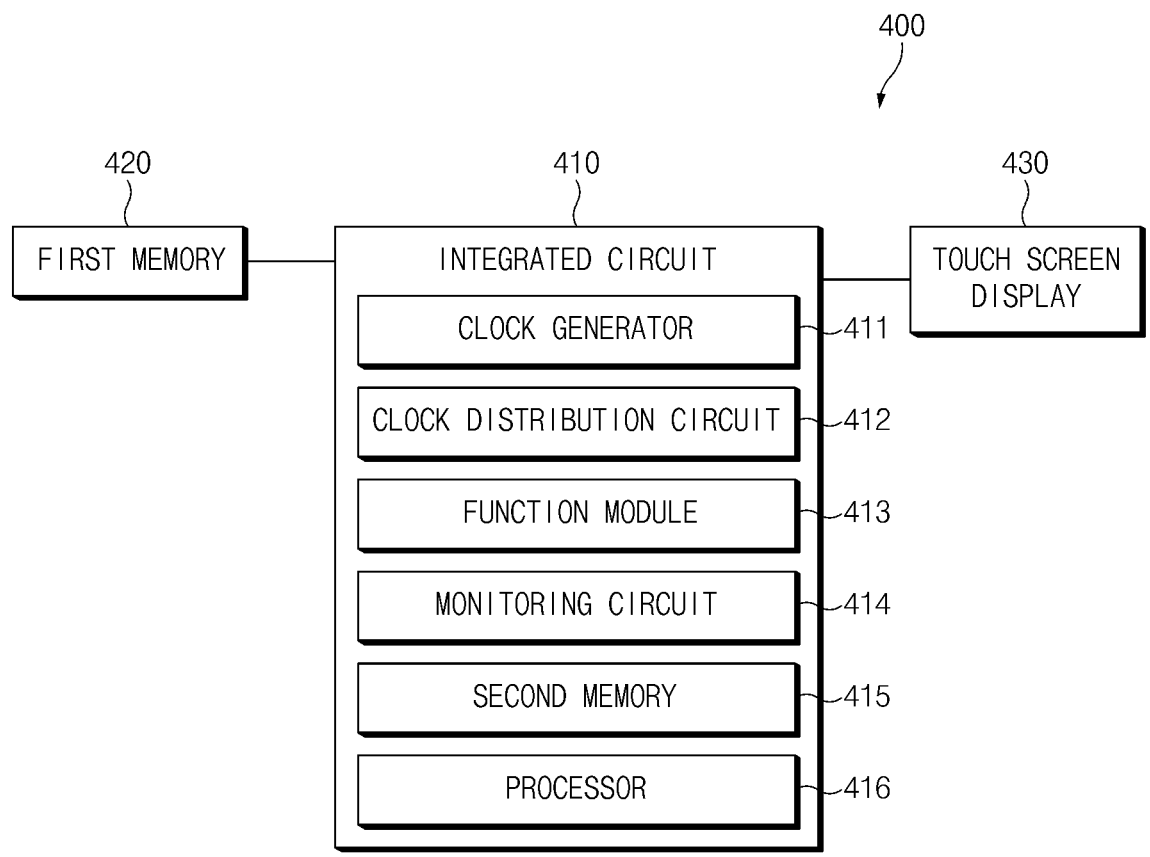
FIG. 4 is a block diagram illustrating an electronic device according to an embodiment.

FIG. 4 is a block diagram illustrating an electronic device according to an embodiment.

Referring to FIG. 4, an electronic device 400 according to an embodiment may include an integrated circuit 410 (e.g., the integrated circuit 100), a first memory 420 (e.g., the memory 160), and a touch screen display 430.

According to an embodiment, the integrated circuit 410 may include at least one clock generator 411 (e.g., the clock generator 110), a clock distribution circuit 412 (e.g., the clock distribution circuit 120), a plurality of function modules 413 (e.g., the function modules 130), a monitoring circuit 414 (e.g., the monitoring circuit 150), a second memory 415 (e.g., the memory 160), and at least one processor 416 (e.g., the control circuit 170).

According to an embodiment, the integrated circuit 410 corresponds to the integrated circuit 100 described with reference to FIG. 1, and thus, additional description associated with the integrated circuit 410 will be omitted to avoid redundancy.

According to an embodiment, the clock generator 411 and the clock distribution circuit 412 may be included in the integrated circuit 410 separately from the function modules 413 and the processor 416.

According to an embodiment, the clock generator 411, the clock distribution circuit 412, and the monitoring circuit 414 may be included in each of the plurality of function modules 413. According to an embodiment, the monitoring circuit 414 may be a sub monitoring circuit included in each of the plurality of function modules 413.

According to an embodiment, the clock generator 411 and the clock distribution circuit 412 may be included in the processor 416.

According to an embodiment, the clock generator 411 and the clock distribution circuit 412 may be included in both the plurality of function modules 413 and the processor 416.

When the processor 416 executes an application program and a supply time for each frequency of a clock corresponds to a specified range, the processor 416 may control at least one of at least one function module 413 of the plurality of function modules 413, the at least one clock generator 411, or the clock distribution circuit 412, based on a specified control method.

According to an embodiment, the processor 416 may control at least one of the clock generator 411 or the clock distribution circuit 412 that are disposed separately from the function modules 413 and the processor 416. According to an embodiment, the processor 416 may control at least one of the clock generator 411 or the clock distribution circuit 412 included in the function modules 413. According to an embodiment, the processor 416 may control at least one of the clock generator 411 or the clock distribution circuit 412 included in the processor 416.

The first memory 420 may store an application program, a resource for providing a service through the application program executable by the processor 416, or the like. According to an embodiment, the first memory 420 may store a mapping table including a control method specified according to a supply time for each frequency of a clock to be supplied to the plurality of function modules 413. According to an embodiment, the first memory 420 may store a mapping table including a category to which a performance status of the electronic device 400 according to a supply time for each frequency of a clock to be supplied to the plurality of function modules 413 corresponds.

According to various embodiments, the mapping table may be stored in the second memory 415 of the integrated circuit 410.

The touch screen display 430 may output an execution screen of the application program, or the like. The touch screen display 430 may receive a touch input from the user.

Figure 5A:
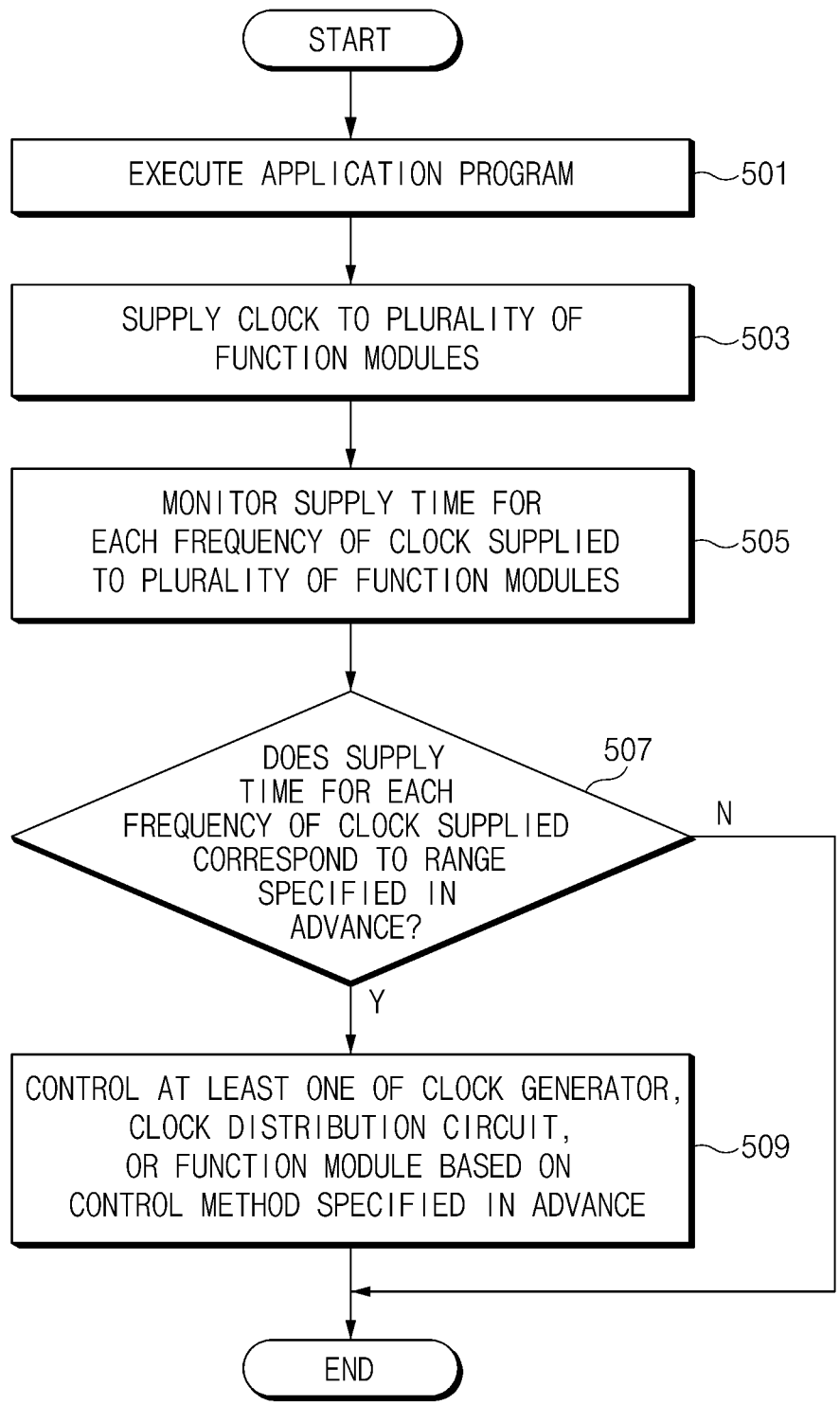
FIG. 5A is a flowchart illustrating a method in which an electronic device according to an embodiment controls a plurality of function modules based on a supply time for each frequency of a clock supplied to the plurality of function modules.

FIG. 5A is a flowchart illustrating a method in which an electronic device according to an embodiment controls a plurality of function modules based on a supply time for each frequency of a clock supplied to the plurality of function modules.

Below, it is assumed that the processor 416 of FIG. 4 performs a process of FIG. 5A.

In operation 501, the processor 416 may execute an application program.

In operation 503, the clock generator 411 and the clock distribution circuit 412 may distribute a clock into the plurality of function modules 413.

In operation 503, the at least one clock generator 411 may generate a clock, and the clock distribution circuit 412 may distribute the generated clock into the plurality of function modules 413. According to an embodiment, a clock to be supplied to the plurality of function modules 413 and whether to supply the clock may be determined based on operating statuses of a plurality of components included in the clock distribution circuit 412.

In operation 505, the monitoring circuit 414 may monitor a supply time for each frequency of a clock that is supplied to the plurality of function modules 413.

For example, the monitoring circuit 414 may monitor that a clock of about 266 MHz is supplied to a GPU for about 200 ms, a clock of about 350 MHz is supplied to the GPU for about 30 ms, and a clock of about 534 MHz is supplied to the GPU for about 100 ms.

According to an embodiment, a clock to be supplied to the plurality of function modules 413 and whether to supply the clock may be determined based on operating statuses of the clock generator 411 and the components included in the clock distribution circuit 412. The monitoring circuit 414 may monitor a clock supply time for each frequency of a clock supplied to the plurality of function modules 413 by monitoring operating statuses of the clock generator 411 and the components included in the clock distribution circuit 412.

According to an embodiment, the monitoring circuit 414 may monitor whether the at least one clock generator 411 operates. According to an embodiment, the monitoring circuit 414 may further monitor an operating time of the at least one clock generator 411.

According to an embodiment, the monitoring circuit 414 may monitor information about selection of a multiplexer, a clock division ratio of a divider, and whether a clock gate is enabled. According to an embodiment, the monitoring circuit 414 may further monitor a times when the divider, the multiplexer, and the clock gate operate in a current status.

According to an embodiment, the supply time for each frequency of the clock monitored by the monitoring circuit 414 may be initialized to a specified cycle. For example, when the specified cycle is 3 seconds, the monitoring circuit 414 may monitor a supply time for each frequency of the clock for 3 seconds, may then initialize the monitored clock supply time, and may then monitor a supply time for each frequency of the clock again.

In operation 507, the processor 416 may determine whether the supply time for each frequency of the clock supplied to the plurality of function modules 413 corresponds to a specified range.

In an embodiment, a specified range associated with a supply time for each frequency of a clock supplied to a GPU may be defined as a clock of about 266 MHz is supplied for 150 to 250 ms, a clock of about 350 MHz is supplied for 20 to 40 ms, and a clock of about 534 MHz is supplied for 70 to 150 ms.

According to an embodiment, when the clock of about 266 MHz is supplied to the GPU for about 200 ms, the clock of about 350 MHz is supplied to the GPU for about 30 ms, and the clock of about 534 MHz is supplied to the GPU for about 100 ms, the processor 416 may determine as corresponding to the specified range.

According to an embodiment, the processor 416 may determine whether a supply time for each frequency of a clock supplied to the plurality of function modules 413 corresponds to the specified range, by using the mapping table stored in the first memory 420 or the second memory 415.

When the supply time for each frequency of the clock supplied to the plurality of function modules 413 corresponds to the specified range, the processor 416 may control at least one of at least one function module 413 of the plurality of function modules 413, the at least one clock generator 411, or the clock distribution circuit 412, based on a specified control method.

According to an embodiment, the control based on the specified control method may include controlling the at least one function module 413 such that a resolution of an application program screen displayed in the touch screen display 430 is changed to a specified resolution. For example, when a supply time for each frequency of a clock supplied to the plurality of function modules 413 corresponds to the specified range in a state where the resolution of the application program screen is an FHD, the processor 416 may control the function module 413 such that the resolution of the application program screen is set to an HD.

According to an embodiment, the control based on the specified control method may include controlling the at least one function module 413 such that a specified sound effect is applied to a sound signal that an application program outputs. For example, when a supply time for each frequency of a clock supplied to the plurality of function modules 413 corresponds to a specified range associated with playing a music, the processor 416 may control the function module 413 such that a specified sound effect is applied to a sound signal that an application program outputs.

According to an embodiment, the control based on the specified control method may include controlling the at least one function module 413 such that an application program screen is displayed in the form of a pop-up window when a user input for selecting a specified object displayed in the touch screen display 430 is received through the touch screen display 430.

For example, when a supply time for each frequency of a clock supplied to the plurality of function modules 413 corresponds to a specified range associated with playing a video, the processor 416 may display an object specified to an application program and may control the function module 413 such that a screen of the application program is displayed in the form of a pop-up window when the object is selected.

According to an embodiment, when a supply time for each frequency of a clock supplied to the plurality of function modules 413 corresponds to a specified range, the processor 416 may determine a category that a performance status of the electronic device 400 corresponds.

For example, when a supply time for each frequency of a clock supplied to the plurality of function modules 413 corresponds to a specified range included in the mapping table, the processor 416 may determine a category corresponding to the specified range included in the mapping table as the category that the performance status of the electronic device 400 corresponds.

According to an embodiment, a category may include at least one of a video playback category, a game execution category, a web surfing category, or a music playback category. However, a kind of a category is not limited to the above examples.

Figure 5B:
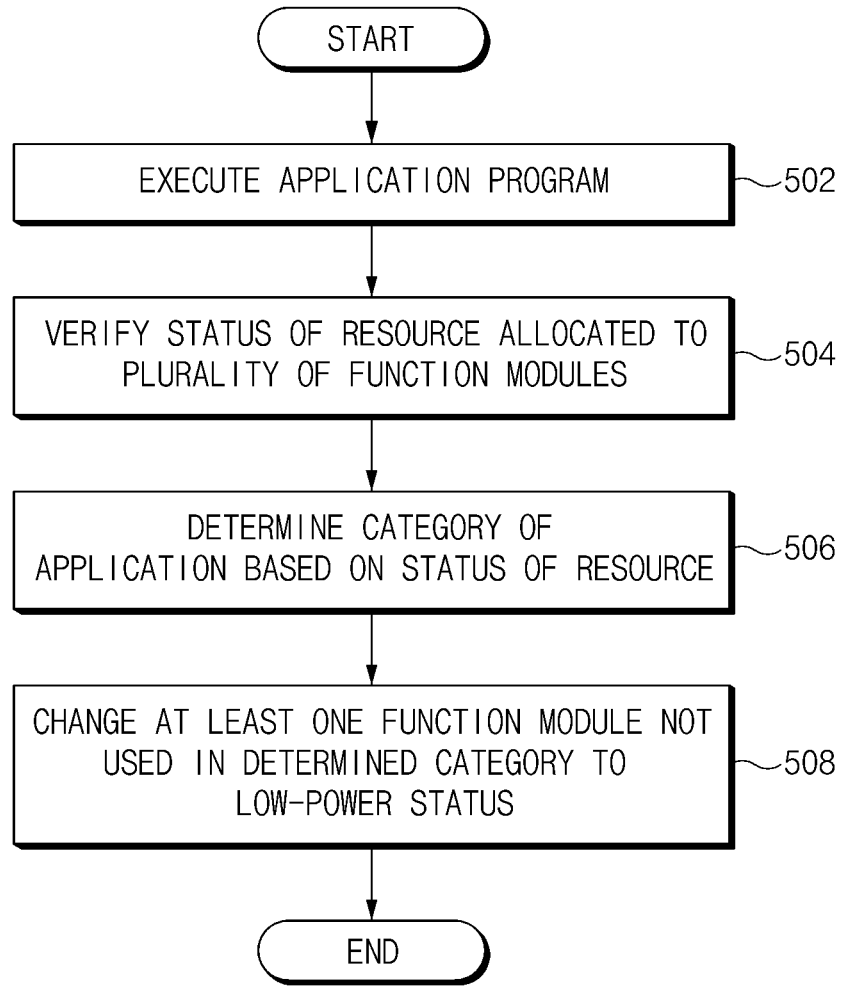
FIG. 5B is a flowchart illustrating a method in which an electronic device according to an embodiment changes statuses of function modules based on a status of a resource allocated to the function modules.

FIG. 5B is a flowchart illustrating a method in which an electronic device according to an embodiment changes statuses of function modules based on a status of a resource allocated to the function modules.

Below, it is assumed that the processor 416 of FIG. 4 performs a process of FIG. 5B.

In operation 502, the processor 416 may execute an application program.

In operation 504, the processor 416 may verify a status of a resource allocated to at least a part of the plurality of function modules 413 with regard to execution of an application.

According to an embodiment, the processor 416 may verify a status of a resource allocated to a function module based on an operating status of the clock distribution circuit 412.

According to an embodiment, the operating status of the clock distribution circuit 412 may include whether components (e.g., a multiplexer, a divider, a clock gate, and the like) included in the clock distribution circuit 412 operate or operating times thereof.

In operation 506, the processor 416 may determine a category of the application, based at least on a status of the allocated resource.

According to an embodiment, a memory may store a mapping table including a category of an application according to a status of a resource.

According to an embodiment, the processor 416 may determine the category of the application based on the mapping table. For example, the processor 416 may determine a category corresponding to the status of the resource allocated to the function module as the category of the currently executed application, by using the mapping table.

In operation 508, the processor 416 may change the at least one function module 413, which is not used in the category, from among the plurality of function modules 413 to a low-power status based at least on the category.

According to an embodiment, when the determined category of the application is an Internet browser, the processor 416 may change a GPU module to the low-power status.

According to an embodiment, changing the at least one function module 413 to the low-power status may include blocking a clock supplied to the at least one function module 413.

Figure 6A:
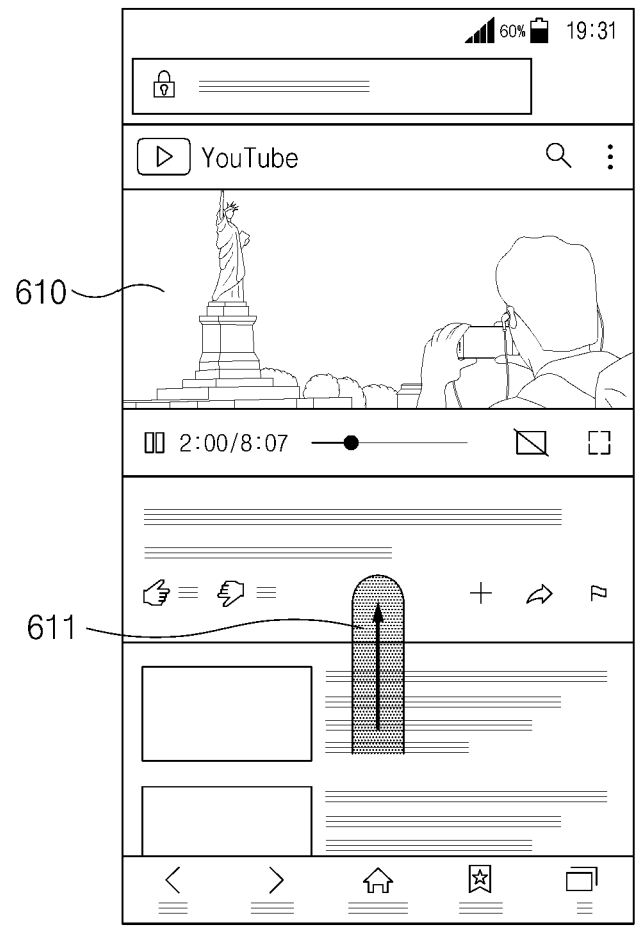
FIG. 6A is a diagram illustrating a screen in which an application program playing a video is executed, according to an embodiment.
Figure 6B:
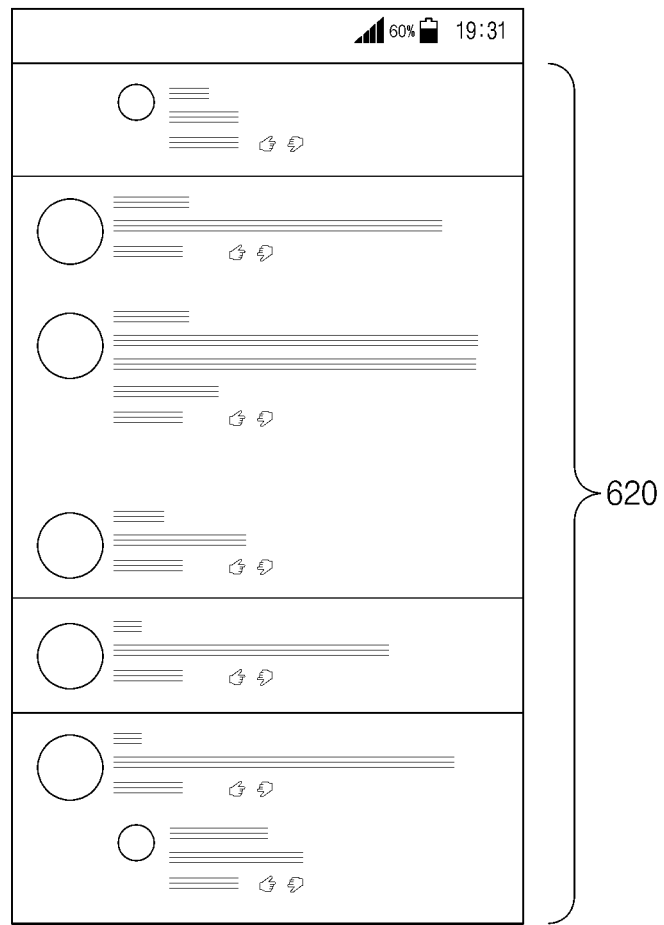
FIG. 6B is a diagram illustrating a screen in which an application program displaying a text is executed, according to an embodiment.

FIG. 6A is a diagram illustrating a screen in which an application program playing a video is executed, according to an embodiment. FIG. 6B is a diagram illustrating a screen in which an application program displaying a text is executed, according to an embodiment.

According to an embodiment, the processor 416 may play a video 610 in a web browser screen as illustrated in FIG. 6A. According to an embodiment, to play the video 610, the clock generator 411 and the clock distribution circuit 412 may supply a clock of a high frequency (e.g., about 900 MHz) to a GPU. According to an embodiment, the processor 416 may determine that the electronic device 400 is in a state of playing a video, based on a frequency of a clock supplied to the GPU and a supply time of the clock, which are monitored by the monitoring circuit 414 (or operating statuses of the clock generator 411 and components included in the clock distribution circuit 412).

According to an embodiment, when a user input 611 for scrolling the web screen is received, the processor 416 may display a comment screen 620 in the web browser screen as illustrated in FIG. 6B.

According to an embodiment, because a video is not played in the comment screen of FIG. 6B, the clock generator 411 and the clock distribution circuit 412 may supply a clock of a low frequency (e.g., about 150 MHz) to the GPU. According to an embodiment, the processor 416 may determine that a frequency of a clock supplied to the GPU and various function modules 413 and a supply time of the clock, which are monitored by the monitoring circuit 414, correspond to a specified range. Alternatively, the processor 416 may determine that operating statuses of the clock generator 411 and components included in the clock distribution circuit 412 correspond to a specified operating status.

According to an embodiment, the processor 416 may determine that the electronic device 400 is in a web browsing status, based on a frequency of a clock supplied to the function module 413 and a supply time of the clock (or operating statuses of the clock generator 411 and components included in the clock distribution circuit 412). According to an embodiment, the processor 416 may control at least one of the clock generator 411, the clock distribution circuit 412, or the function module 413 in a control method associated with a specified range that a frequency of a clock and a supply time of the clock correspond (or a control method corresponding to operating statuses of the clock generator 411 and components included in the clock distribution circuit 412). For example, to reduce power consumption, the processor 416 may reduce or block a power of the function module 413 unnecessary in the web browsing status. For example, the processor 416 may control a power management module to block a power supplied to a video codec block 413.

Figure 7B:
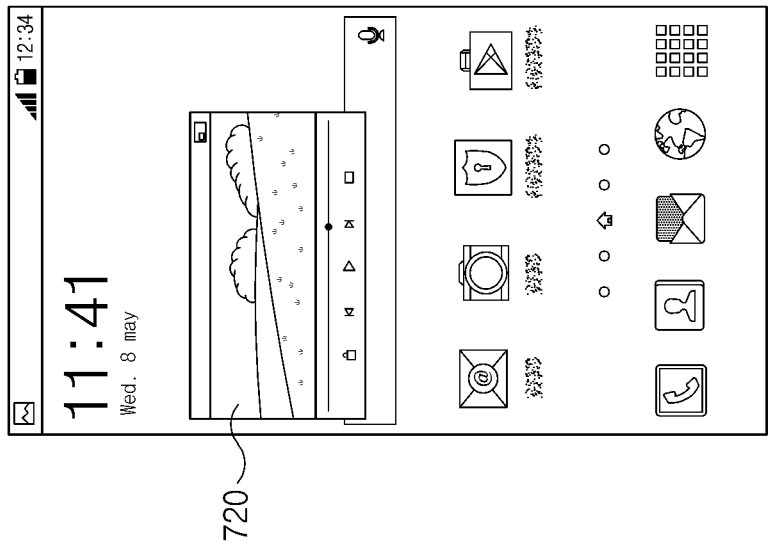
FIG. 7B is a diagram illustrating how an application program screen is displayed in the form of a pop-up, according to an embodiment.
Figure 7A:
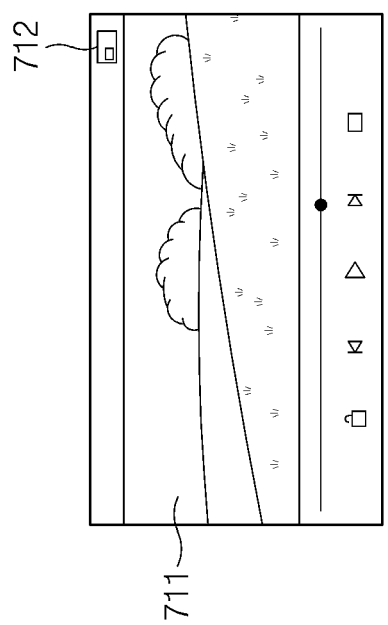
FIG. 7A is a diagram illustrating how an application program screen is displayed in a full screen mode, according to an embodiment.

FIG. 7A is a diagram illustrating how an application program screen is displayed in a full screen mode, according to an embodiment. FIG. 7B is a diagram illustrating how an application program screen is displayed in the form of a pop-up, according to an embodiment.

According to an embodiment, as illustrated in FIG. 7A, the processor 416 may execute a video playback application program to play a video 711 in a full screen mode. According to an embodiment, to play the video 711, the clock generator 411 and the clock distribution circuit 412 may supply a clock of a high frequency to a GPU and the video codec block 413. According to an embodiment, in the processor 416, a frequency of a clock supplied to the GPU and a supply time of the clock, which are monitored by the monitoring circuit 414, may correspond to a specified range. Alternatively, operating statuses of the clock generator 411 and components included in the clock distribution circuit 412 may correspond to a specified operating status.

According to an embodiment, the processor 416 may control at least one of the clock generator 411, the clock distribution circuit 412, or the function module 413 in a control method associated with a specified range that a frequency of a clock and a supply time of the clock correspond (or a control method corresponding to operating statuses of the clock generator 411 and components included in the clock distribution circuit 412). For example, the processor 416 may display a specified object 712 in the touch screen display 430.

According to an embodiment, when a user input for selecting the object is received, the processor 416 may control the display 430 or the function module 413 such that an application program screen is displayed in the form of a pop-up window 720.

As such, a function that an application program does not provide may be provided by providing a pop-up function of the application program by using a frequency of a clock supplied to the function module 413 and a supply time of the clock (or operating statuses of the clock generator 411 and components included in the clock distribution circuit 412). Also, even though whether an application program is an application program of any category is not stored in a memory of the electronic device 400, the processor 416 may determine a category of the executed application program by using a frequency of a clock supplied to the function module 413 and a supply time of the clock (or operating statuses of the clock generator 411 and components included in the clock distribution circuit 412).

Figure 8A:
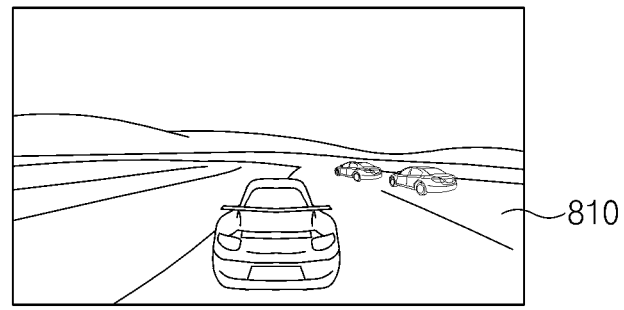
FIG. 8A is a diagram illustrating a game execution screen of an application program according to an embodiment.
Figure 8B:
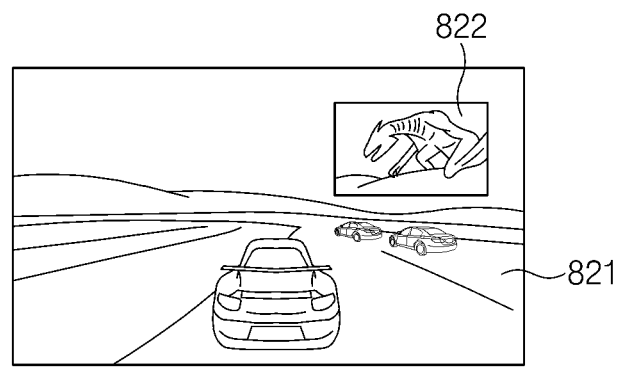
FIG. 8B is a diagram illustrating game and video execution screens of an application program according to an embodiment.

FIG. 8A is a diagram illustrating a game execution screen of an application program according to an embodiment. FIG. 8B is a diagram illustrating game and video execution screens of an application program according to an embodiment.

According to an embodiment, as illustrated in FIGS. 8A and 8B, the processor 416 may execute a game application program to display a game screen 810 or 821. According to an embodiment, the processor 416 may play a video 822 together with the game screen as illustrated in FIG. 8B.

According to an embodiment, when the processor 416 displays only the game screen as illustrated in FIG. 8A, a clock may not be supplied to the video codec block 413. In contrast, when the processor 416 displays only the game screen as illustrated in FIG. 8B, a clock of a high frequency may be supplied to the video codec block 413.

According to an embodiment, a supply time for each frequency of a clock supplied to the function module 413 (or operating statuses of the clock generator 411 and components included in the clock distribution circuit 412) when the electronic device 400 operates as illustrated in FIG. 8A may be different from a supply time for each frequency of a clock supplied to the function module 413 (or operating statuses of the clock generator 411 and components included in the clock distribution circuit 412) when the electronic device 400 operates as illustrated in FIG. 8B. The processor 416 may differently determine an operating status of the electronic device 400 based on the monitored supply time for each frequency of the clock supplied to the function module 413 (or the operating statuses of the clock generator 411 and components included in the clock distribution circuit 412). The processor 416 may control at least one of the clock generator 411, the clock distribution circuit 412, or the function module 413 in a different control method based on the determined operating status.

According to an embodiment, the first memory 420 or the second memory 415 may store a list of game application programs. According to an embodiment, the list may include a first application program and may not include a second application program.

According to an embodiment, the first memory 420 or the second memory 415 may include a supply time for each frequency of a clock supplied to the function module 413 (or operating statuses of the clock generator 411 and components included in the clock distribution circuit 412) when a game application program is executed and a specified control method when the game application program is executed.

According to an embodiment, when the processor 416 executes the first application program, the processor 416 may determine that the first application program is a game application program with reference to the list and may control at least one of the clock generator 411, the clock distribution circuit 412, or the function module 413 based on the specified control method.

According to an embodiment, when the processor 416 executes the first application program, the processor 416 may fail to determine that the second application program is a game application program with reference to the list.

However, the processor 416 may determine whether a monitored supply time for each frequency of a clock supplied to the function module 413 (or operating statuses of the clock generator 411 and components included in the clock distribution circuit 412) corresponds to a supply time for each frequency of a clock supplied to the function module 413 (or operating statuses of the clock generator 411 and components included in the clock distribution circuit 412) when the game application program is executed.

According to an embodiment, the processor 416 may determine that the second application program is a game application program based on the supply time for each frequency of the clock supplied to the function module 413 (or the operating statuses of the clock generator 411 and components included in the clock distribution circuit 412) and may control at least one of the clock generator 411, the clock distribution circuit 412, or the function module 413 based on the specified control method.

Figure 9:
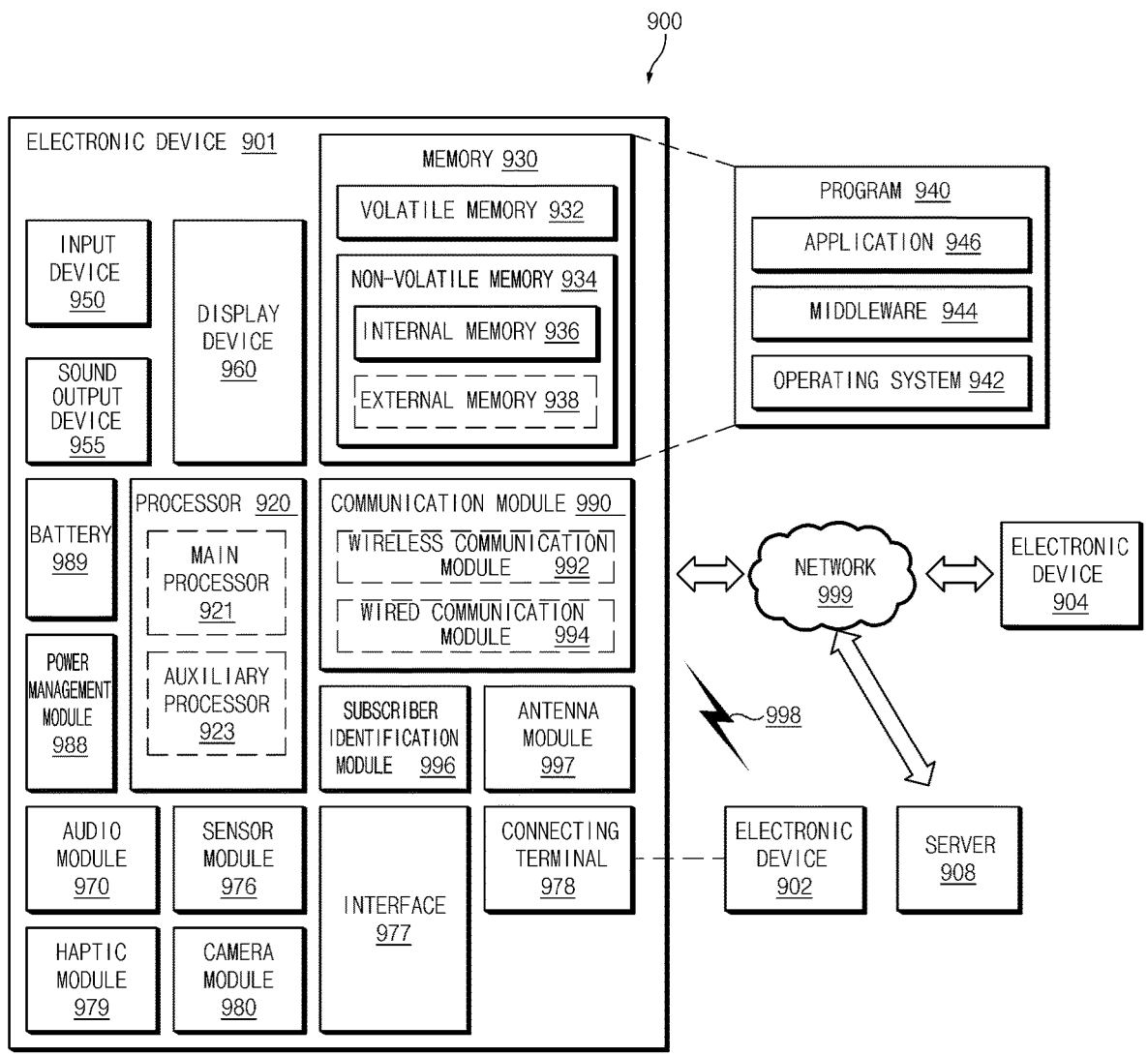
FIG. 9 is a block diagram of an electronic device in a network environment according to various embodiments.

FIG. 9 is a block diagram of an electronic device in a network environment according to various embodiments. Referring to FIG. 9, an electronic device 901 may communicate with an electronic device 902 through a first network 998 (e.g., a short-range wireless communication) or may communicate with an electronic device 904 or a server 908 through a second network 999 (e.g., a long-distance wireless communication) in a network environment 900. According to an embodiment, the electronic device 901 may communicate with the electronic device 904 through the server 908.

According to an embodiment, the electronic device 901 may include a processor 920, a memory 930, an input device 950, a sound output device 955, a display device 960, an audio module 970, a sensor module 976, an interface 977, a haptic module 979, a camera module 980, a power management module 988, a battery 989, a communication module 990, a subscriber identification module 996, and an antenna module 997. According to some embodiments, at least one (e.g., the display device 960 or the camera module 980) among components of the electronic device 901 may be omitted or other components may be added to the electronic device 901. According to some embodiments, some components may be integrated and implemented as in the case of the sensor module 976 (e.g., a fingerprint sensor, an iris sensor, or an illuminance sensor) embedded in the display device 960 (e.g., a display).

The processor 920 may operate, for example, software (e.g., a program 940) to control at least one of other components (e.g., a hardware or software component) of the electronic device 901 connected to the processor 920 and may process and compute a variety of data. The processor 920 may load a command set or data, which is received from other components (e.g., the sensor module 976 or the communication module 990), into a volatile memory 932, may process the loaded command or data, and may store result data into a nonvolatile memory 934. According to an embodiment, the processor 920 may include a main processor 921 (e.g., a central processing unit or an application processor) and an auxiliary processor 923 (e.g., a graphic processing device, an image signal processor, a sensor hub processor, or a communication processor), which operates independently from the main processor 921, additionally or alternatively uses less power than the main processor 921, or is specified to a designated function. In this case, the auxiliary processor 923 may operate separately from the main processor 921 or embedded.

In this case, the auxiliary processor 923 may control, for example, at least some of functions or states associated with at least one component (e.g., the display device 960, the sensor module 976, or the communication module 990) among the components of the electronic device 901 instead of the main processor 921 while the main processor 921 is in an inactive (e.g., sleep) state or together with the main processor 921 while the main processor 921 is in an active (e.g., an application execution) state. According to an embodiment, the auxiliary processor 923 (e.g., the image signal processor or the communication processor) may be implemented as a part of another component (e.g., the camera module 980 or the communication module 990) that is functionally related to the auxiliary processor 923.

The memory 930 may store a variety of data used by at least one component (e.g., the processor 920 or the sensor module 976) of the electronic device 901, for example, software (e.g., the program 940) and input data or output data with respect to commands associated with the software. The memory 930 may include the volatile memory 932 or the nonvolatile memory 934.

The program 940 may be stored in the memory 930 as software and may include, for example, an operating system 942, a middleware 944, or an application 946.

The input device 950 may be a device for receiving a command or data, which is used for a component (e.g., the processor 920) of the electronic device 901, from an outside (e.g., a user) of the electronic device 901 and may include, for example, a microphone, a mouse, or a keyboard.

The sound output device 955 may be a device for outputting a sound signal to the outside of the electronic device 901 and may include, for example, a speaker used for general purposes, such as multimedia play or recordings play, and a receiver used only for receiving calls. According to an embodiment, the receiver and the speaker may be either integrally or separately implemented.

The display device 960 may be a device for visually presenting information to the user of the electronic device 901 and may include, for example, a display, a hologram device, or a projector and a control circuit for controlling a corresponding device. According to an embodiment, the display device 960 may include a touch circuitry or a pressure sensor for measuring an intensity of pressure on the touch.

The audio module 970 may convert a sound and an electrical signal in dual directions. According to an embodiment, the audio module 970 may obtain the sound through the input device 950 or may output the sound through an external electronic device (e.g., the electronic device 902 (e.g., a speaker or a headphone)) wired or wirelessly connected to the sound output device 955 or the electronic device 901.

The sensor module 976 may generate an electrical signal or a data value corresponding to an operating state (e.g., power or temperature) inside or an environmental state outside the electronic device 901. The sensor module 976 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 977 may support a designated protocol wired or wirelessly connected to the external electronic device (e.g., the electronic device 902). According to an embodiment, the interface 977 may include, for example, an HDMI (high-definition multimedia interface), a USB (universal serial bus) interface, an SD card interface, or an audio interface.

A connecting terminal 978 may include a connector that physically connects the electronic device 901 to the external electronic device (e.g., the electronic device 902), for example, an HDMI connector, a USB connector, an SD card connector, or an audio connector (e.g., a headphone connector).

The haptic module 979 may convert an electrical signal to a mechanical stimulation (e.g., vibration or movement) or an electrical stimulation perceived by the user through tactile or kinesthetic sensations. The haptic module 979 may include, for example, a motor, a piezoelectric element, or an electric stimulator.

The camera module 980 may shoot a still image or a video image. According to an embodiment, the camera module 980 may include, for example, at least one lens, an image sensor, an image signal processor, or a flash.

The power management module 988 may be a module for managing power supplied to the electronic device 901 and may serve as at least a part of a power management integrated circuit (PMIC).

The battery 989 may be a device for supplying power to at least one component of the electronic device 901 and may include, for example, a non-rechargeable (primary) battery, a rechargeable (secondary) battery, or a fuel cell.

The communication module 990 may establish a wired or wireless communication channel between the electronic device 901 and the external electronic device (e.g., the electronic device 902, the electronic device 904, or the server 908) and support communication execution through the established communication channel. The communication module 990 may include at least one communication processor operating independently from the processor 920 (e.g., the application processor) and supporting the wired communication or the wireless communication. According to an embodiment, the communication module 990 may include a wireless communication module 992 (e.g., a cellular communication module, a short-range wireless communication module, or a GNSS (global navigation satellite system) communication module) or a wired communication module 994 (e.g., an LAN (local area network) communication module or a power line communication module) and may communicate with the external electronic device using a corresponding communication module among them through the first network 998 (e.g., the short-range communication network such as a Bluetooth, a WiFi direct, or an IrDA (infrared data association)) or the second network 999 (e.g., the long-distance wireless communication network such as a cellular network, an internet, or a computer network (e.g., LAN or WAN)). The above-mentioned various communication modules 990 may be implemented into one chip or into separate chips, respectively. According to an embodiment, the wireless communication module 992 may identify and authenticate the electronic device 901 using user information stored in the subscriber identification module 996 in the communication network.

The antenna module 997 may include one or more antennas to transmit or receive the signal or power to or from an external source. According to an embodiment, the communication module 990 (e.g., the wireless communication module 992) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 901 and the external electronic device 904 through the server 908 connected to the second network 999. Each of the electronic devices 902 and 904 may be the same or different types as or from the electronic device 901. According to an embodiment, all or some of the operations performed by the electronic device 901 may be performed by another electronic device or a plurality of external electronic devices. When the electronic device 901 performs some functions or services automatically or by request, the electronic device 901 may request the external electronic device to perform at least some of the functions related to the functions or services, in addition to or instead of performing the functions or services by itself. The external electronic device receiving the request may carry out the requested function or the additional function and transmit the result to the electronic device 901. The electronic device 901 may provide the requested functions or services based on the received result as is or after additionally processing the received result. To this end, for example, a cloud computing, distributed computing, or client-server computing technology may be used.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 940) including an instruction stored in a machine-readable storage media (e.g., an internal memory 936 or an external memory 938) readable by a machine (e.g., a computer). The machine may be a device that calls the instruction from the machine-readable storage media and operates depending on the called instruction and may include the electronic device (e.g., the electronic device 901). When the instruction is executed by the processor (e.g., the processor 920), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

The invention claimed is:

1. An integrated circuit comprising:
   at least one clock generator;
   a clock distribution circuit configured to distribute a clock generated by the at least one clock generator;
   a plurality of function modules configured to receive the clock distributed by the clock distribution circuit;
   a monitoring circuit configured to monitor operating statuses of the at least one clock generator and the clock distribution circuit;
   a memory; and
   at least one control circuit, wherein the at least one control circuit is configured to:
   when the operating statuses of the at least one clock generator and the clock distribution circuit monitored by the monitoring circuit correspond to a specified operating status, control at least one of at least one function module of the plurality of function modules, the at least one clock generator, or the clock distribution circuit based on a specified control method, and
   turn on or off one or more function modules specified in advance from among the plurality of function modules based on the specified control method.

2. The integrated circuit of claim 1, wherein the clock distribution circuit includes at least one multiplexer, at least one divider, and a plurality of clock gates.

3. The integrated circuit of claim 2, wherein the operating status of the at least one clock generator includes whether the at least one clock generator operates, and the operating status of the clock distribution circuit includes information about selection of the multiplexer, a clock division ratio of the divider, and whether the clock gate is enabled.

4. The integrated circuit of claim 3, wherein the operating status of the at least one clock generator further includes a time during which the at least one clock generator operates, and the operating status of the clock distribution circuit further includes a time during which the multiplexer, the divider, and the clock gate operate in a current status.

5. The integrated circuit of claim 1, wherein the monitoring circuit includes:
   sub monitoring circuits configured to monitor operating statuses of the at least one clock generator and components included in the clock distribution circuit, respectively; and
   a main monitoring circuit configured to receive information about the operating statuses of the at least one clock generator and the components included in the clock distribution circuit from the sub monitoring circuits.

6. The integrated circuit of claim 1, wherein the memory is configured to:
   store a mapping table including a specified control method according to the operating statuses of the at least one clock generator and the clock distribution circuit sensed by the monitoring circuit.

7. The integrated circuit of claim 6, wherein the at least one control circuit is configured to:
   control the at least one of the at least one function module of the plurality of function modules, the at least one clock generator, and the clock distribution circuit based on the specified control method by suing the mapping table.

8. The integrated circuit of claim 1, wherein the clock distribution circuit includes a plurality of nodes, and
   wherein the at least one control circuit is configured to:
   when operating statuses of the at least one clock generator and the plurality of nodes are maintained in a specified operating status during a time specified in advance, control the at least one of the at least one function module of the plurality of function modules, the at least one clock generator, and the clock distribution circuit based on a specified control method.

9. The integrated circuit of claim 1, wherein the at least one control circuit is configured to:
   control the at least one clock generator and the clock distribution circuit based on the specified control method such that a clock of a specified frequency is supplied to one or more function modules specified in advance from among the plurality of function modules.

10. The integrated circuit of claim 1, wherein at least one function module of a plurality of function modules includes a plurality of sub function modules, and wherein the specified control method is configured to turn on or off one or more sub function modules specified in advance from among a plurality of sub function modules.

11. The integrated circuit of claim 1, wherein the clock distribution circuit includes a plurality of nodes, and
wherein the at least one control circuit is configured to:
when operating statuses of the at least one clock generator and the plurality of nodes correspond to a specified operating status, determine a category to which a performance status of the integrated circuit corresponds.

12. The integrated circuit of claim 11, wherein the memory stores a mapping table including a category to which a performance status of the integrated circuit according to the operating statuses of the at least one clock generator and the clock distribution circuit detected by the monitoring circuit corresponds.

13. The integrated circuit of claim 12, wherein the at least one control circuit is configured to:
determine the category, to which the performance status of the integrated circuit corresponds, by using the mapping table.

14. The integrated circuit of claim 11, wherein the category includes at least one of a video playback category, a game execution category, a web surfing category, or a music playback category.

\* \* \* \* \*